(12) United States Patent
Goeoetz et al.

(10) Patent No.: US 9,537,064 B2
(45) Date of Patent: Jan. 3, 2017

(54) METHOD FOR THE PRODUCTION OF A WAVELENGTH CONVERSION ELEMENT, WAVELENGTH CONVERSION ELEMENT, AND COMPONENT COMPRISING THE WAVELENGTH CONVERSION ELEMENT (71) Applicant: OSRAM Opto Semiconductors GmbH, Regensburg (DE)

(72) Inventors: Britta Goeoetz, Regensburg (DE); Martin Brandl, Kelheim (DE); Markus Burger, Regensburg (DE); Norwin Von Malm, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/889,837

(22) PCT Filed: May 6, 2014

(86) PCT No.: PCT/EP2014/059231
§ 371 (c)(1),
(2) Date: Nov. 6, 2015

(87) PCT Pub. No.: WO2014/180842
PCT Pub. Date: Nov. 13, 2014

(65) Prior Publication Data
US 2016/0104822 A1    Apr. 14, 2016

(30) Foreign Application Priority Data

May 8, 2013  (DE) .................... 10 2013 104 776

(51) Int. Cl.
H01L 33/00 (2010.01)
H01L 33/50 (2010.01)
B29D 11/00 (2006.01)
F21V 9/16 (2006.01)
H01L 33/54 (2010.01)
B29K 83/00 (2006.01)

(52) U.S. Cl.
CPC ......... *H01L 33/505* (2013.01); *B29D 11/0074* (2013.01); *B29D 11/00932* (2013.01); *F21V 9/16* (2013.01); *H01L 33/508* (2013.01); *B29K 2083/00* (2013.01); *H01L 33/501* (2013.01); *H01L 33/54* (2013.01); *H01L 2933/0041* (2013.01)

(58) Field of Classification Search
CPC ............................. H01L 33/505; H01L 33/508
USPC .......................................... 257/98
See application file for complete search history.

(56) References Cited

U.S. PATENT DOCUMENTS

2005/0072021 A1    4/2005  Steiger et al.

FOREIGN PATENT DOCUMENTS

| DE | 102004019973 A1 | 9/2005 |
| DE | 102005034793 B3 | 4/2007 |
| DE | 102007053286 A1 | 4/2009 |
| DE | 102010045403 A1 | 3/2012 |

(Continued)

*Primary Examiner* — Anthony Ho
(74) *Attorney, Agent, or Firm* — McDermott Will & Emery LLP (57) ABSTRACT Disclosed is a method for producing a wavelength conversion element (10) wherein a wavelength conversion layer (100) is provided, the surface thereof is treated with a plasma (50), and the wavelength conversion layer is punched. Also disclosed are a wavelength conversion layer and an optoelectronic component comprising a wavelength conversion layer.

17 Claims, 10 Drawing Sheets (56) References Cited

FOREIGN PATENT DOCUMENTS

| | | |
|---|---|---|
| DE | 112010004173 T5 | 11/2012 |
| DE | 102011078689 A1 | 1/2013 |
| WO | 2009/118985 A2 | 10/2009 |
| WO | 2012/022576 A1 | 2/2012 |
| WO | 2012/023764 A2 | 2/2012 |
| WO | 2012/169289 A1 | 12/2012 |

METHOD FOR THE PRODUCTION OF A WAVELENGTH CONVERSION ELEMENT, WAVELENGTH CONVERSION ELEMENT, AND COMPONENT COMPRISING THE WAVELENGTH CONVERSION ELEMENT

The invention relates to a method for the production of a wavelength conversion element, to a wavelength conversion element and to a component which comprises the wavelength conversion element.

Light-emitting diodes (LEDs) generate light in a narrow wavelength range, by which a monochromatic light impression is usually obtained. In order to obtain a polychromatic or mixed-color light impression, dyes are usually subordinated to an LED, which dyes partially convert the light emitted by the LED into light with a different wavelength. By superimposing the converted light with the light primarily emitted by the LED, it is possible to obtain a broader wavelength spectrum which may impart the polychromatic or mixed-color light impression.

The wavelength-converting dyes are in this case generally embedded in the wavelength conversion layers which need to be separated into wavelength conversion elements in order to be usable in the optoelectronic component. It has not to date been possible to carry out the separation with satisfying quality. Separation with the aid of lasers can lead to blackening of the element and therefore to brightness losses of the LED, sawing does not offer any possibility of producing recesses in the element, and water-jet cutting leads to an inferior edge quality of the wavelength conversion element.

It is an object of at least one embodiment of the invention to provide an improved method for producing a wavelength conversion element. Further objects are to provide a wavelength conversion element having improved properties, and to provide a component which comprises such a wavelength conversion element.

A method for producing a wavelength conversion element is provided, which comprises the following method steps:

A) providing a wavelength conversion layer having a first surface and a second surface opposite the first surface, the second surface being arranged on a carrier layer, B) treating the first surface with a plasma, C) stamping at least the wavelength conversion layer, wherein at least one wavelength conversion element having a first surface and an opposite second is being obtained.

In method step A), a wavelength conversion layer is initially produced, which may be carried out for example by compression molding, injection molding or injection-compression molding.

In relation to the first and second surfaces of the wavelength conversion layer and the wavelength conversion element, "opposite" respectively means a substantially mutually parallel arrangement of the surfaces.

The wavelength conversion element may have a main extension plane in which it extends in the lateral directions. Perpendicularly to the main extent plane, in the vertical direction, the wavelength conversion element may have a thickness. The thickness of the wavelength conversion element is preferably small compared with the maximum extent of the wavelength conversion element in a lateral direction. A main plane of the wavelength conversion element forms the first surface of the wavelength conversion element.

The following comments relating to properties, compositions, materials and fill factors of the wavelength conversion layer apply equally for the wavelength conversion element which is separated from the wavelength conversion layer. The separation in this case takes place without physical or chemical modification of the wavelength conversion layer or only with modification of the first and/or second surface of the wavelength conversion layer.

The wavelength conversion layer comprises at least one wavelength conversion substance, which is embedded surface-wide in a matrix material. The wavelength conversion substance may, in particular, be suitable for at least partially absorbing light (primary radiation) generated by a semiconductor chip and emitting this as secondary radiation with a wavelength range at least partially differing from the primary radiation. The primary radiation and the secondary radiation may comprise one or more wavelengths and/or wavelength ranges in an infrared to ultraviolet wavelength range, particularly in a visible wavelength range. In this case, the spectrum of the primary radiation and/or the spectrum of the secondary radiation may be narrow-band, that is to say the primary radiation and/or the secondary radiation may have a monochromatic or approximately monochromatic wavelength range. As an alternative, the spectrum of the primary radiation and/or the spectrum of the secondary radiation may also be broad-band, that is to say the primary radiation and/or the secondary radiation may have a mixed-color wavelength range, in which case the mixed-color wavelength range may have a continuous spectrum or a plurality of discrete spectral components in different wavelength ranges. The primary radiation and the secondary radiation may, when superimposed, impart a white-colored light impression. As an alternative, the wavelength conversion element may convert the primary radiation fully into secondary radiation, a case which may be referred to as so-called full conversion.

The wavelength conversion substance may in this case comprise one or more of the following materials: garnets of the rare earths and alkaline-earth metals, for example YAG: $Ce^{3+}$, nitrides, nitridosilicates, SiONs, SiAlONs, aluminates, oxides, halophosphates, orthosilicates, sulfides, vanadates and chlorosilicates. Furthermore, in addition or as an alternative, the wavelength conversion substance may comprise an organic material, which may be selected from a group which comprises perylenes, benzopyrenes, coumarins or rhodamines and azo dyes.

The wavelength conversion layer may, as wavelength conversion substance embedded in a matrix material, comprise suitable mixtures and/or combinations of said wavelength conversion substances. The matrix material may enclose or contain the wavelength conversion substance or be chemically bonded to the wavelength conversion substance. The wavelength conversion substance may in this case be distributed homogeneously in the matrix material. The wavelength conversion substance may for example be configured in the form of particles, which may have a size of less than or equal to 100 μm, and in particular between 2 μm and 30 μm.

Furthermore, the wavelength conversion layer may comprise as matrix material a transparent matrix material, in which the wavelength conversion substance is embedded. The transparent matrix material may be selected from a group which comprises glass, siloxanes, epoxides, acrylates, methyl methacrylates, imides, carbonates, urethanes or derivatives thereof in the form of monomers, oligomers or polymers and further mixtures, copolymers or compounds thereof. For example, the matrix material may comprise or be an epoxy resin, polymethyl methacrylate (PMMA), polycarbonate, polyacrylate, polyurethane or a silicone resin such as polysiloxane, or mixtures thereof.

In particular, the matrix material may comprise a silicone resin or be silicone. By virtue of its thermoplastic properties, silicone may on the one hand be readily processable and, on the other hand, have a radiation stability necessary for a wavelength conversion element as well as required optical properties, for example a transparency.

Furthermore, the wavelength conversion layer may also comprise a silicone. In the case of a silicone, Si—O groups and/or Si—OH groups may be generated on the plasma-treated surface of the wavelength conversion layer by means of the plasma. It is furthermore possible for the wavelength conversion layer to comprise a hydrolysable chemical group.

The wavelength conversion substance may be present in the matrix material with a fill factor which is for example ≥15% and ≤80%.

The wavelength conversion layer comprises a first surface and a second surface opposite the first surface, which may also be referred to as the upper side and lower side of the wavelength conversion layer. The second surface, or the lower side, is in this case arranged on a carrier layer.

The plasma, with which the first surface is treated in method step B), may be an oxidative plasma, for example an oxygen and/or ozone plasma. In this case, "treating" is intended to be interpreted as meaning that the first surface is exposed to the plasma until a modification of the surface takes place. The modification may, for example, be a chemical reaction induced by the plasma reacting with molecules or substituents of molecules of the matrix material in the wavelength conversion layer, which are arranged on the first surface. In the case of a matrix material containing silicone, $C_mH_n$ groups may then be oxidized so that $SiO_2$ remains on the surface. The modification may also be induced by reorganization of polymers of the matrix material which are arranged on the first surface. By the modification, the stickiness of the first surface may be lowered, or the surface adhesion of the first surface, for example of the silicone, may be reduced. A vitrification by an ashing process due to the plasma treatment may also be referred to. For this reason, even very sticky or elastic matrix materials, which are present in the wavelength conversion layer, can be stamped in method step C).

During the vitrification by the plasma treatment, oxygen is incorporated into the sticky material of the wavelength conversion layer by means of the oxygen and/or ozone plasma. The effect of this is that the sticky material of the wavelength conversion layer is converted into a less sticky glass material on the vitrified surface of the wavelength conversion layer. The vitrified surface may in this case be the first surface and/or the second surface. The wavelength conversion layer thus then contains a sticky material and a glass material, wherein the glass material results from the sticky material by addition of oxygen and/or OH groups.

By the vitrification, it is furthermore possible to reduce the adhesion of contaminating substances on the vitrified surface of the wavelength conversion layer. The extent of the reduction of the stickiness may in this case be determined by the extent of the reduction of the adhesion. In other words, the less sticky the material is, the lower is the adhesion of impurities. Furthermore, a reduced surface roughness in comparison with the surface roughness of the vitrified surface before the vitrification can be concluded from a lower adhesion.

The vitrification may, in particular, have a certain penetration depth. In other words, after the vitrification by the plasma treatment, the wavelength conversion layer may be vitrified, i.e. comprise a glass, in the vertical direction, that is to say perpendicularly to the vitrified surface, to a penetration depth which may correspond for example to at most 2%, preferably at most 1%, of the thickness of the wavelength conversion layer. For example, the penetration depth is at least 30 nm and at most 600 nm. The wavelength conversion layer may thus comprise glass along a direction which extends within the scope of production tolerances perpendicularly to the first surface, from the vitrified surface as far as a penetration depth. After the penetration depth, the wavelength conversion layer comprises a mixture of the vitrified and unvitrified material of the wavelength conversion layer.

In method step C), at least the wavelength conversion layer is stamped, wherein at least one wavelength conversion element is obtained. Whether one or more wavelength conversion elements are obtained in a method step C) depends on whether the stamping tool used can stamp only one wavelength conversion element or a plurality of wavelength conversion elements simultaneously. The same applies for the following comments regarding the method even if the term "at least one" is not explicitly used in relation to the wavelength conversion element produced.

Method step C) may be repeated several times, so that a plurality of wavelength conversion elements can be separated from a wavelength conversion layer produced in method step A) and treated with a plasma in method step B), wherein the provision and the plasma treatment of the wavelength conversion layer is carried out only once, before the first method step C) is carried out.

The wavelength conversion element comprises a first surface and an opposite second surface, which corresponds to regions of the first and second, optionally plasma-treated surfaces of the wavelength conversion layer. The wavelength conversion element furthermore comprises side edges, which together with the first surface or with the second surface form edges.

Method step C) therefore concerns separation of the wavelength conversion element from the wavelength conversion layer.

In the method, the carrier layer may be removed after the method step B). The plasma treatment may therefore be carried out on the first surface while the carrier layer is still arranged on the second surface of the wavelength conversion layer. This may possibly make complicated holders for the wavelength conversion layer during the plasma treatment unnecessary.

As an alternative, the carrier layer may also be removed before method step B), i.e. before the plasma treatment of the first surface of the wavelength conversion layer. In this case, the first surface and simultaneously the second surface of the wavelength conversion layer may be treated with a plasma.

In the method, furthermore, the second surface of the wavelength conversion layer may be treated with a plasma in a method step B1) following method step B). This may, in particular, be carried out if the carrier layer is removed after the method step B). In this case, the first and second surfaces of the wavelength conversion layer are treated with a plasma not simultaneously but successively. For the treatment of the second surface of the wavelength conversion layer with a plasma, the comments regarding the plasma treatment of the first surface of the wavelength conversion layer apply similarly.

Furthermore, in method step C), the wavelength conversion layer may be stamped and the wavelength conversion element may be collected in a container. The wavelength conversion element, which has been treated on the first and second surface with a plasma, is therefore obtained without a carrier in a container. The container may be used in order to transport the wavelength conversion element and, in further method steps, to sort it using a machine and test it for its properties. Lastly, the wavelength conversion element may be applied on an auxiliary layer or auxiliary layer and subsequently transferred to a semiconductor chip, onto which it is intended to be applied. The auxiliary layer may be a removable film, for example a thermal release film or a UV release film.

Method step C) may in this case be repeated several times so that a plurality of wavelength conversion elements may be collected in the container and processed further, as mentioned for the one wavelength conversion element.

According to another embodiment, the carrier layer may be removed before or after method step B), and, in method step C), the wavelength conversion layer may be stamped, wherein the wavelength conversion element is arranged with the second surface on an auxiliary layer. The auxiliary layer may be a removable film, for example a thermal release film or a UV release film. In this embodiment, therefore, the second surface of the wavelength conversion element is stamped on an auxiliary layer. Method step C) may be repeated several times, so that a plurality of wavelength conversion elements are arranged, or stamped, together on the auxiliary layer. In this case, after each time method step C) is carried out, the stamping tool is moved parallel relative to the auxiliary layer so that the wavelength conversion element produced in the next method step C) is stamped on a region of the auxiliary layer on which a wavelength conversion element is not arranged, yet.

The wavelength conversion element or elements arranged on the auxiliary layer may be tested, sorted and transported. If applicable, the wavelength conversion element or elements may be arranged with their first surface on a new auxiliary layer for the subsequent transfer, wherein the auxiliary layer on the side of the second surface of the wavelength conversion elements is removed. In this embodiment, the plasma treatment is necessary from only one side, the first surface of the wavelength conversion element.

According to another embodiment, the wavelength conversion layer may be arranged on the carrier layer, and in method step C) the wavelength conversion layer and the carrier layer may be stamped together. In this case, the wavelength conversion element arranged on the stamped carrier layer is obtained. In this embodiment, only the first surface of the wavelength conversion layer is treated with plasma. The side edges of the stamped carrier layer and of the wavelength conversion element arranged thereon may in this case be arranged congruently above one another.

Furthermore, in method step C), the stamped carrier layer may be arranged with the side facing away from the wavelength conversion element on an adhesive layer. The wavelength conversion element, which is arranged on the stamped carrier layer, which is in turn arranged on an adhesive layer, is therefore obtained.

Method step C) may be repeated several times so that a plurality of wavelength conversion elements, which are respectively arranged on a stamped carrier layer, are obtained. Furthermore, the multiple wavelength conversion elements, which are arranged on stamped carrier layers, may be arranged jointly on an adhesive layer in method step C). To this end, after each carried-out method step C), the adhesive layer is moved parallel relative to the stamping tool so that the wavelength conversion element obtained in the next method step C), which is arranged on a stamped carrier layer, is arranged on a region of the adhesive layer which is free of stamped carrier layers and wavelength conversion elements.

Furthermore, in a method step C1) following method step C), an auxiliary layer may be arranged on the first surface of the wavelength conversion element and the adhesive layer may be removed. A removable film, for example a thermal release film or a UV release film, may be used as the auxiliary layer. As soon as this is applied on the first surface of the wavelength conversion element, the adhesive film is removed from the wavelength conversion element together with the stamped carrier layer. As an alternative, the adhesive layer may be removed first, and afterwards the stamped carrier layer may be removed in a separate process. In this way, the wavelength conversion element, which is arranged with the first surface on the auxiliary layer, is obtained. It may subsequently be tested for its properties and sorted, and, if applicable, applied onto a new auxiliary layer, in order to be transported afterwards.

If method step C) is repeated several times, the auxiliary layer may be applied onto all wavelength conversion elements arranged on the adhesive layer, and the adhesive layer and the stamped carrier layers may be removed from all wavelength conversion elements.

Very sticky or elastic matrix materials in the wavelength conversion layer can therefore be stamped, wherein edges of the wavelength conversion elements which may be rounded by the stamping process are located in a controlled way on one side, for example on the lower side or on the second surface of the wavelength conversion element, and sharp edges are located in a controlled way on the other side, for example on the first surface of the wavelength conversion element.

Here and in the following, sharp edges are understood to mean that they approximately comprise an angle of 90°, which is formed by the first and/or second surface of the wavelength conversion element and the side edge. A sharp edge is advantageous, in particular, if the wavelength conversion element is enclosed by a potting which is intended to be flush with one of the surfaces of the wavelength conversion element.

Furthermore, a stamping tool that has an internal shape which is selected from quadrilateral or nearly quadrilateral, round, quadrilateral or nearly quadrilateral with at least one recess, and round with at least one recess, may be used in method step C). Other shapes, for example polygonal, oval or asymmetrical shapes, respectively with or without recesses, may likewise be envisioned. Here and in the following, a "recess" is intended to mean that at the edge, in particular at the circumferential edge, of the wavelength conversion element, there is an indentation which is produced by the internal shape of the stamping tool. Furthermore, a recess may also be present inside the surface of the wavelength conversion element. For example, there may be two recesses at the edge of a wavelength conversion element. The two recesses may, for example, be arranged next to one another or opposite each other.

Recesses may be used in order to allow access through the wavelength conversion element to an underlying semiconductor chip in an optoelectronic component, and to use this access for example for contacting the semiconductor chip.

With the described method, it is thus possible to stamp a wavelength conversion layer and therefore separate wavelength conversion elements, without damaging the wavelength conversion substance contained therein or the matrix material. This is furthermore cost-effective method for producing wavelength conversion elements with sharp edges for a subsequent potting intended to end at one surface of the wavelength conversion element. The method for producing the wavelength conversion element is furthermore cheaper than the production of ceramic platelets which are used as wavelength conversion platelets. With the stamping process, better surfaces and a better edge quality are obtained than is possible, for example, by means of a screen printing method.

A wavelength conversion element, which is produced by the method mentioned above, is furthermore provided. The wavelength conversion element may have sharp edges on the side of the first and/or second surface. In this way, for example, the second surface of the wavelength conversion element may approximately make an angle of 90° with the side edges of the wavelength conversion element.

The wavelength conversion element may have a thickness which is selected from the range of 30 μm to 300 μm. The thickness may in this case be specified along a direction which extends, within the scope of production tolerances, perpendicularly to the first surface of the wavelength conversion element. With the method mentioned above, depending on the application field of the wavelength conversion element, wavelength conversion elements of different thicknesses may be produced. Furthermore, the wavelength conversion element may have an area which is selected from the range of 0.1 mm$^2$ to 20 mm$^2$, in particular from the range of 0.1 mm$^2$ to 10 mm$^2$, preferably from the range of 0.25 mm$^2$ to 5 mm$^2$, and for example from the range of 0.5 mm$^2$ to 2 mm$^2$.

An optoelectronic component is furthermore provided, which comprises a radiation-emitting semiconductor chip and a wavelength conversion element according to the comments above, which is arranged with the first surface or the second surface on the semiconductor chip in the beam path of the semiconductor chip. The wavelength conversion element is therefore arranged on the semiconductor chip, in which case a connecting layer that is used for attaching the wavelength conversion element on the semiconductor chip may be arranged between the upper side of the semiconductor chip and the wavelength conversion element. The light-emitting semiconductor chip may for example be configured as a light-emitting diode comprising a semiconductor layer sequence, based on an arsenide, phosphide and/or nitride compound semiconductor material system, having an active region generating light. Such semiconductor chips are known to the person skilled in the art and will not be mentioned in further detail here.

The optoelectronic component comprising the semiconductor chip and the wavelength conversion element may furthermore, for example, be arranged on a carrier and/or in a housing and be electrically contactable by means of electrical connections, for example by means of a so-called lead frame.

Furthermore, the wavelength conversion element may comprise at least one recess as described above, which may be arranged over the upper side of the semiconductor chip and in which a contact region of the semiconductor chip is arranged. In other words, a contact region of the semiconductor chip, for example on the surface of the semiconductor chip may be accessible through the wavelength conversion element, so that the semiconductor chip may be accessible through the wavelength conversion element for wire contacting, for example a bonding contact. The optoelectronic component may furthermore comprise a bonding wire which is connected through the recess to the contact region of the semiconductor chip. The contact region may in this case be arranged in an edge region of the upper side or alternatively in a central region, at a distance from the edge, of the upper side of the semiconductor chip, in which case the recess of the wavelength conversion element correspondingly may also be arranged at the edge, i.e. particularly in the region of the circumferential edge, or in a central region.

The component may furthermore comprise a potting which encloses the semiconductor chip and is flush with the second surface or the first surface of the wavelength conversion element. The wavelength conversion element produced by the method described above has sharp edges on the side of the second surface and/or of the first surface. The potting therefore encloses the semiconductor chip and the wavelength conversion element. The potting may for example contain $TiO_2$ and silicone, and therefore be opaque or of low transmission for the radiation. Alternative materials for the potting may be selected from $SiO_2$, $Al_2O_3$ and $BaSO_4$, which may respectively be mixed with silicone.

Aspects of the invention will be explained in more detail below by means of the following figures and exemplary embodiments.

In the exemplary embodiments and figures, components which are the same or have the same effect may respectively be provided with the same reference signs. The shown elements and their size proportions with respect to one another are in principle not to be regarded as true to scale, rather, individual elements, for example layers, parts, components and regions, may be represented as being dimensioned exaggeratedly thick or large for better representability and/or better understanding.

Figure 1A:
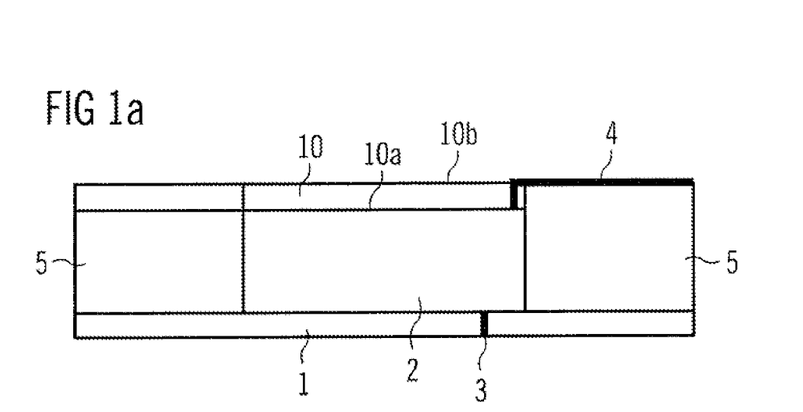
FIG. 1a shows the schematic side view of an optoelectronic component.

FIG. 1a shows the schematic side view of an optoelectronic component having a semiconductor chip 2 and a wavelength conversion element 10. The wavelength conversion element 10 is arranged with a first surface 10a on the semiconductor chip, which is in turn arranged on a carrier 1. The semiconductor chip 2 and the wavelength conversion element 10 are enclosed by a potting 5, which is flush with the second surface 10b of the wavelength conversion element. The wavelength conversion element 10 has a recess 11, through which a contacting 4 leads to the semiconductor chip 2. A second contacting 3 leads through the carrier 1 to the semiconductor chip 2.

Not shown here is a further embodiment, according to which the wavelength conversion element 10 has a second recess 11, through which the contacting 3 leads to the semiconductor chip. Furthermore, as an alternative, the two contactings 3 and 4 may lead through the carrier 1 to the semiconductor chip 2. In this case, the wavelength conversion element 10 would not have recesses.

The potting 5 may for example be an opaque or low-transmissive, preferably a highly reflective, potting containing $TiO_2$. The wavelength conversion element 10 may contain one or more of the matrix materials mentioned above and wavelength conversion substances distributed therein. Primary radiation emitted by the semiconductor chip 2 therefore strikes the wavelength conversion element 10, which at least partially converts the primary radiation emitted by the semiconductor chip into secondary radiation.

Figure 1B:
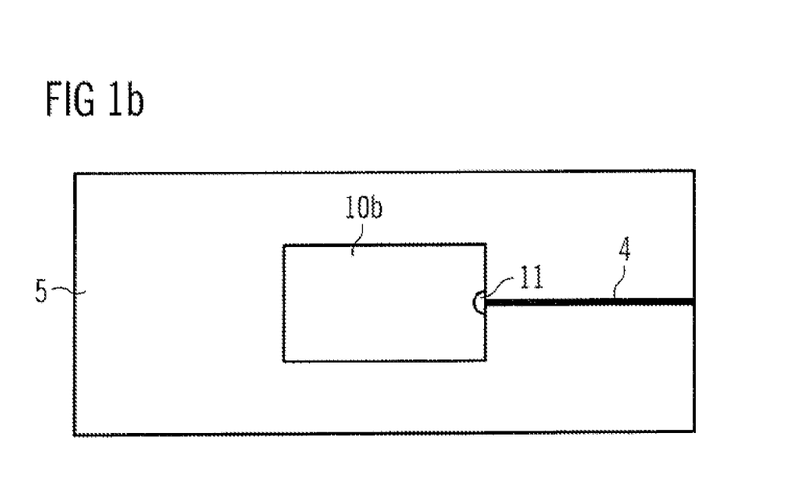
FIG. 1b shows the schematic plan view of an optoelectronic component.

FIG. 1b shows the schematic plan view of the optoelectronic component comprising the potting 5 and the second surface 10b of the wavelength conversion element. Here, the recess 11 in the wavelength conversion element 10 can be seen, through which the contacting 4 is fed.

Figure 2A:
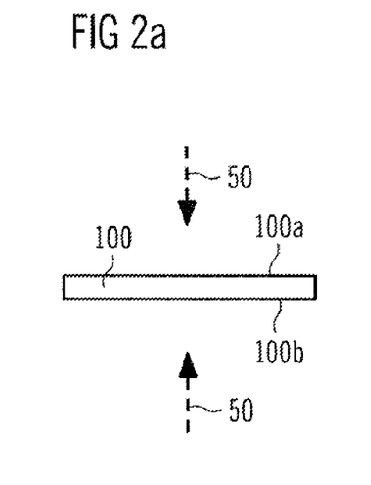
FIGS. 2a to 2c schematically show steps of the method according to the invention according to a first embodiment, FIGS. 3a to 3c schematically show steps of the method according to the invention according to a second embodiment, FIGS. 4a to 4c schematically show steps of the method according to the invention according to a third embodiment.
Figure 2B:
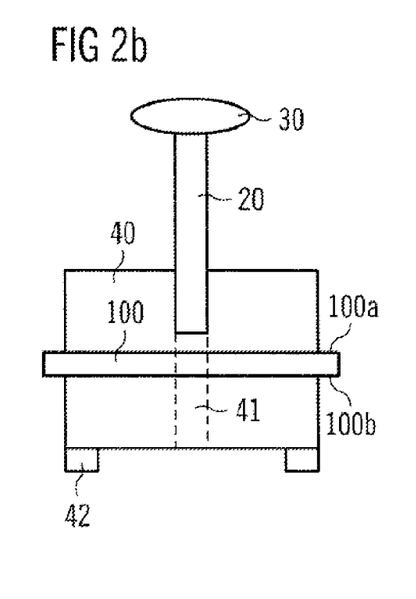
Figure 2C:
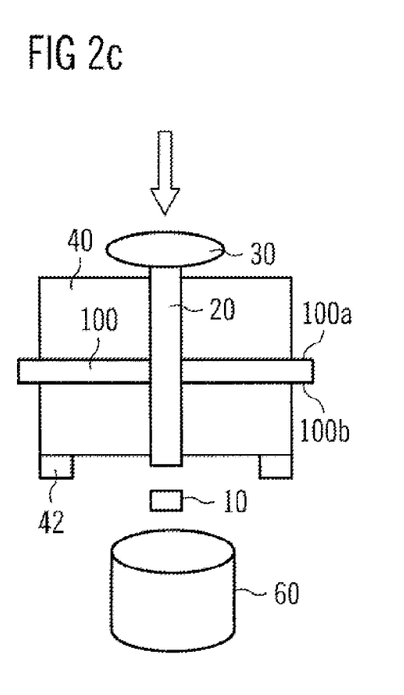

FIGS. 2a to 2c show a first embodiment of the method for producing a wavelength conversion element 10.

FIG. 2a shows a wavelength conversion layer 100, which is treated on both sides with a plasma 50 (schematically indicated by a dashed arrow), for example an oxygen plasma. This is a simplified representation of the method. It may also be possible for the wavelength conversion layer 100 to be arranged on a carrier 200 (not shown here) and initially to treat only the first surface 100a of the wavelength conversion layer with a plasma 50, then remove the carrier 200 and finally treat the second surface 100b, or lower side, with the plasma 50.

FIG. 2b shows the wavelength conversion layer 100, which is fastened in a stamping tool 40 with feet 42 and a cavity 41. The stamping tool itself comprises the stamp 20 and the handle 30, which are fed through the stamping tool 40 through the cavity 41.

FIG. 2c shows the stamp 20, which is fed through the stamping tool 40, and which in this case has stamped out the wavelength conversion element 10. The wavelength conversion element 10 is collected in the container 60 and can be further transported from there and/or processed in the container, or while being arranged on a transport layer. The stamping represented in FIG. 2c may be repeated several times, the wavelength conversion layer 100 being moved after each repetition in such a way that a further wavelength conversion element 10 can be stamped out. The obtained wavelength conversion elements 10 may be collected together in the container 60.

Figure 3A:
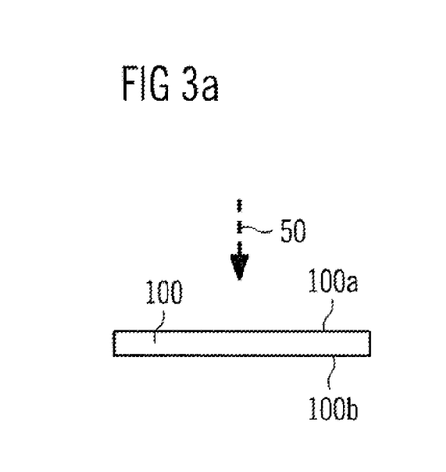

FIG. 3a shows the wavelength conversion layer 100 which is treated on the first surface 100a with a plasma 50. This is again a simplified representation, since the wavelength conversion layer 100 may be arranged on a carrier 200, in which case the carrier 200 may be removed after the plasma treatment.

Figure 3B:
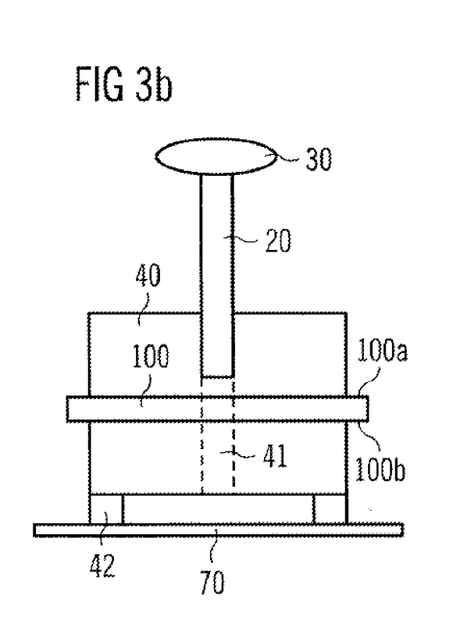

FIG. 3b in turn shows the stamping tool 40, in which the wavelength conversion layer 100 is arranged. In contrast to FIG. 2b, in this case the stamping tool 40 is arranged with the feet 42 on an auxiliary layer 70, for example a thermal release film.

Figure 3C:
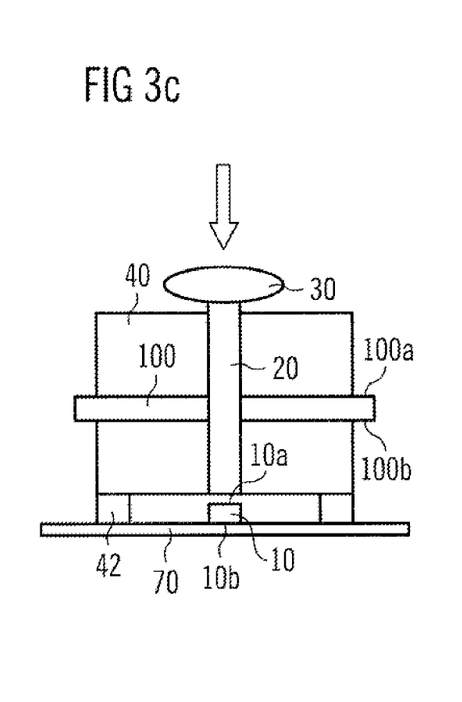

During the stamping process, which is schematically represented in FIG. 3c, the wavelength conversion element 10 is arranged with its second surface 10b directly on the auxiliary layer 70. The first surface 10a of the wavelength conversion element is on the side of the wavelength conversion element facing away from the auxiliary layer 70. On this auxiliary layer 70, the wavelength conversion element 10 may be tested, optionally sorted and arranged on a new auxiliary layer 70. The stamping process shown in FIG. 3b may be repeated several times, after each repetition the wavelength conversion layer 100 being moved in order to obtain a new wavelength conversion element 10, and the auxiliary layer 70 likewise being moved in order to arrange the new wavelength conversion element 10 on a region of the auxiliary layer 70 which is free of wavelength conversion elements 10 (not shown here).

Figure 4A:
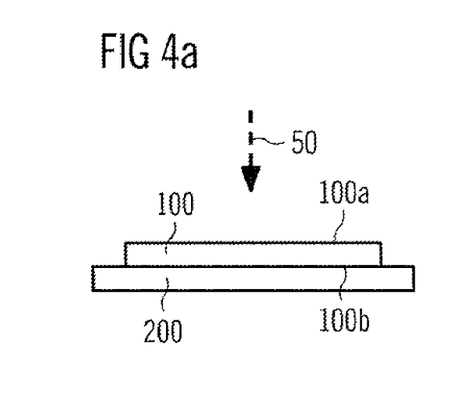

FIG. 4a shows a third embodiment of the method. Here, the wavelength conversion layer 100 is arranged on a carrier 200. The first surface 100a of the wavelength conversion layer is treated on one side by a plasma 50.

Figure 4B:
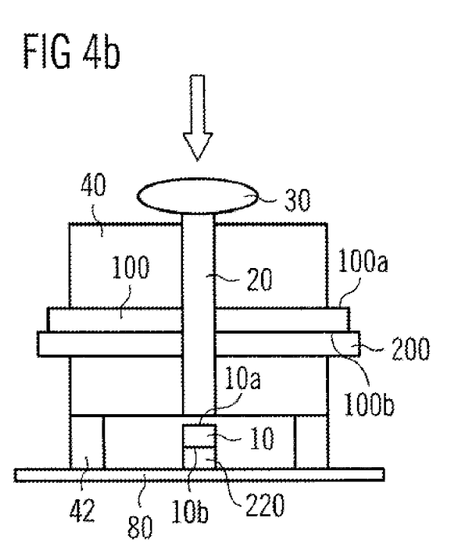

FIG. 4b shows that both the carrier layer 200 and the plasma-treated wavelength conversion layer 100 are arranged in the stamping tool 40. The stamping tool 40 is arranged with the feet 42 on an adhesive layer 80. After the stamping process, the stamped carrier layer 220 and the wavelength conversion element 10 are arranged on the adhesive layer 80, the wavelength conversion element 10 being arranged with its second surface 10b on the stamped carrier layer 220.

Figure 4C:
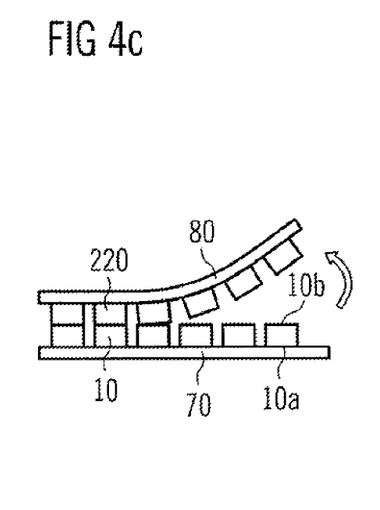

FIG. 4c shows that an auxiliary layer 70 is arranged on the first surface 10a, facing away from the stamped carrier layer 220, of the wavelength conversion element 10, and the adhesive layer 80 together with the stamped carrier layer 220 are removed from the wavelength conversion element. In FIG. 4c, a plurality of wavelength conversion elements 10 and stamped carrier layers 220, which are obtained on the adhesive layer 80 after a corresponding number of stamping processes, are already shown.

FIGS. 1a to 4c respectively show stamping tools which produce only one wavelength conversion element during one stamping process. As an alternative, the stamping tool may also be configured in such a way that a plurality of wavelength conversion elements are obtained simultaneously during one stamping process. This is not shown here for the sake of clarity.

Wavelength conversion elements which were produced by means of embodiments of the method will be presented below. In the examples shown in FIGS. 5 and 6, a wavelength conversion element with an area of 1 mm² is shown, which was vitrified on both sides by means of an oxygen plasma and collected in a container after the stamping process, i.e. after the separation. The wavelength conversion element contains, for example, silicone as a matrix material and the dyes I (a yellow-green luminescent substance) and II (a red luminescent substance). Exemplary luminescent substances are oxides or nitrides, oxynitrides, SiAlONs and orthosilicates. The thickness of the wavelength conversion element is about 110 µm.

FIGS. 7 and 8 show a wavelength conversion element which has an area of 2 mm², was treated with an oxygen plasma only on one side, and during the separation was stamped on a thermal release film as an auxiliary layer. The thickness and the materials are the same as in the examples of FIGS. 5 and 6.

Before the separation method, the wavelength conversion layer was respectively arranged on a carrier layer.

Figure 5A:
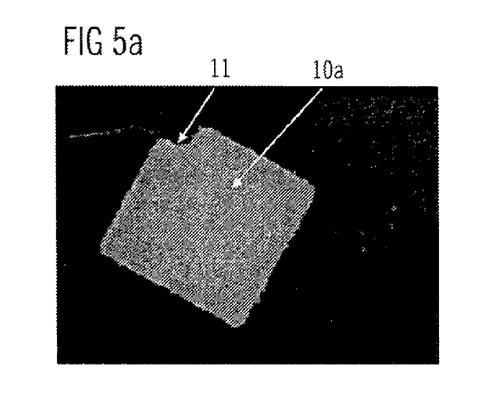
FIGS. 5a to 5d show microscopic images of a wavelength conversion element which is produced according to a first embodiment of the method.
Figure 5B:
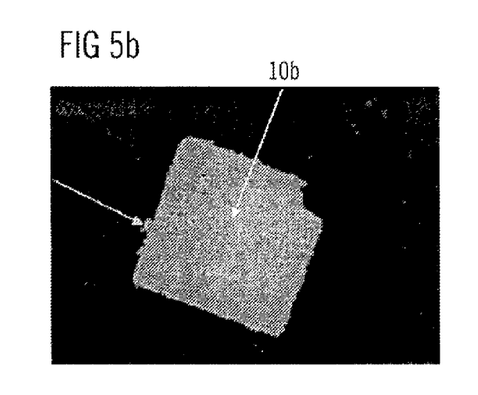
Figure 5C:
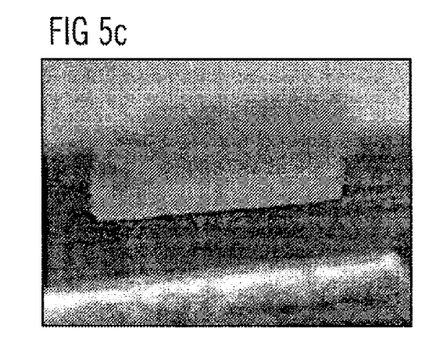
Figure 5D:
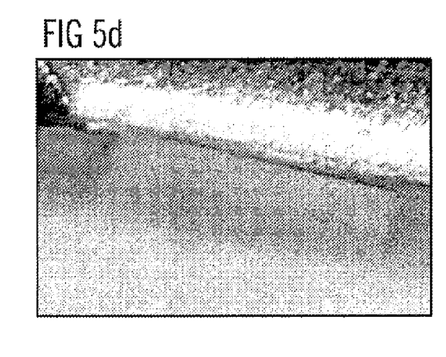

FIGS. 5a to 5d show microscopic images of the wavelength conversion element. FIG. 5a shows the first surface 10a, or upper side, of the wavelength conversion element, and FIG. 5b shows the second surface 10b, or lower side, of the wavelength conversion element. FIGS. 5c and 5d respectively show enlarged details with the side edges of the wavelength conversion element. As can be seen in the figures, the wavelength conversion element is a quadrilateral wavelength conversion element, which has a recess 11 at a corner.

Figure 6A:
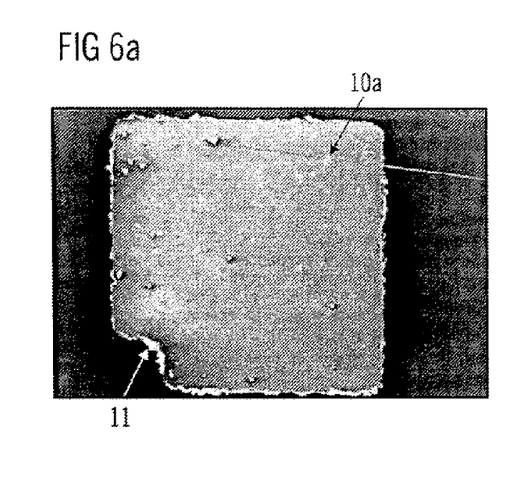
FIGS. 6a to 6g show electron-microscopic images of a wavelength conversion element which is produced according to a first embodiment of the method.
Figure 6B:
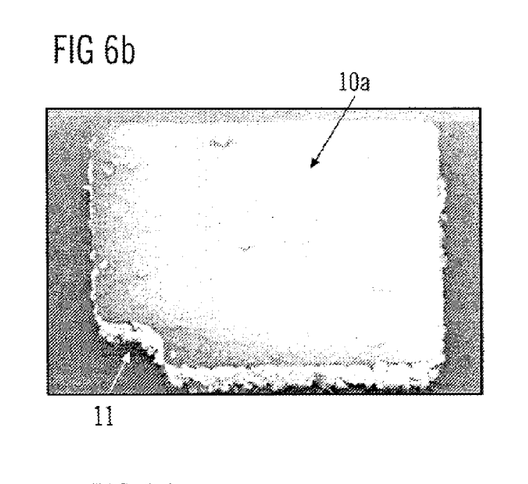
Figure 6C:
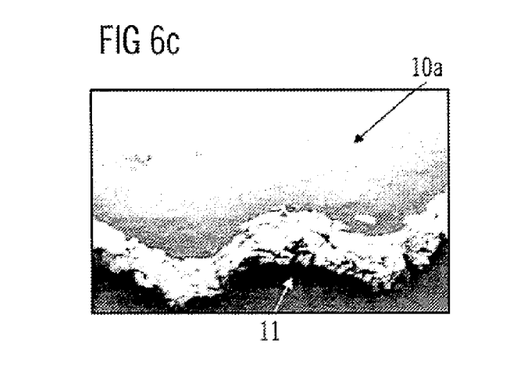
Figure 6D:
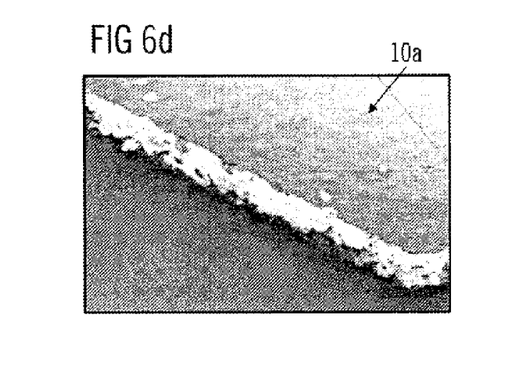
Figure 6E:
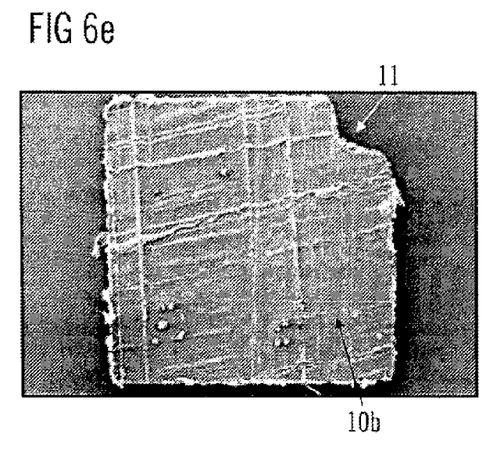
Figure 6F:
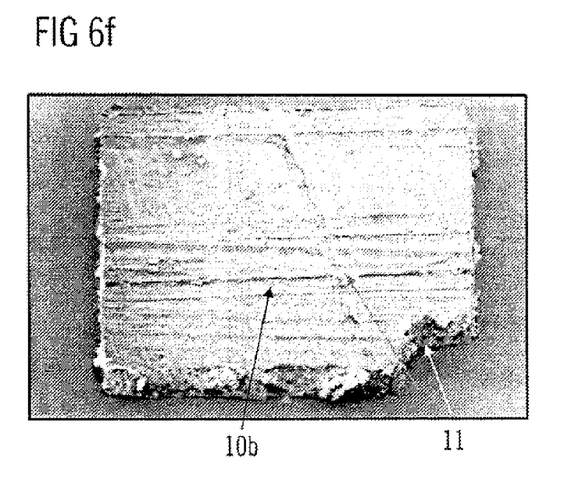
Figure 6G:
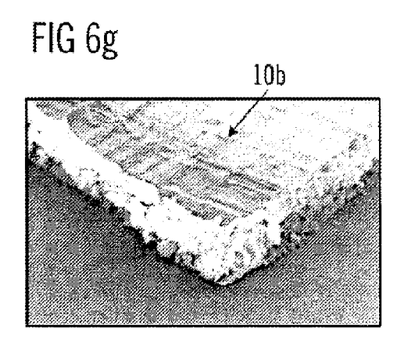

FIGS. 6a to 6g respectively show electron-microscopic images of the wavelength conversion element. FIGS. 6a to 6d show the first surface 10a, and FIGS. 6e to 6g show the second surface 10b of the wavelength conversion element. Particularly in FIGS. 6b and 6d, sharp edges between the first surface 10a and the side edges of the wavelength conversion element can be seen clearly. It can furthermore be seen that the vitrification of the first surface 10a only has a small penetration depth which corresponds to about 1% of the thickness of the wavelength conversion element. FIG. 6c shows an enlargement of the recess 11 at the corner of the wavelength conversion element.

Figure 7A:
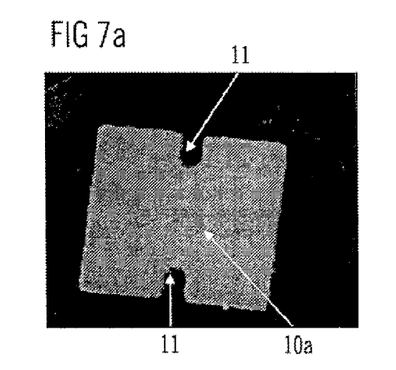
FIGS. 7a to 7e show microscopic images of a wavelength conversion element which is produced according to a second embodiment of the method.
Figures 7B, 7D:
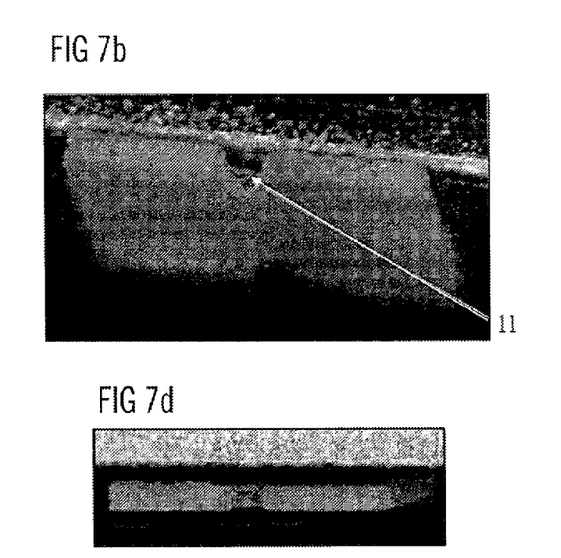
Figure 7C:
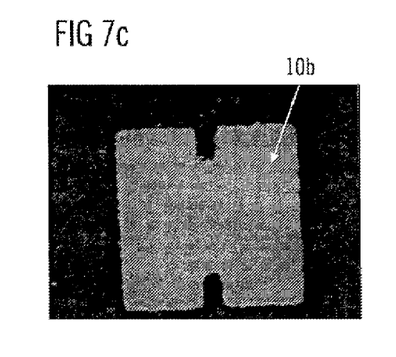
Figure 7E:
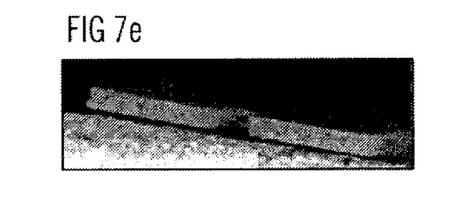

FIGS. 7a to 7e show microscopic images of a wavelength conversion element, which is produced as described above. Here, two recesses 11 have been made on opposite sides of the wavelength conversion element, as can be seen in FIGS. 7a to 7e. FIG. 7a shows the first surface 10a of the wavelength conversion element, and FIG. 7c shows the second surface 10b of the wavelength conversion element. FIG. 7d shows an enlargement of a side view of the wavelength conversion element, the second surface, or lower side, being shown above and the first surface, or upper side, being shown below. FIG. 7e shows an enlarged side view of the wavelength conversion element, the first surface, or upper side, being arranged above and the second surface, or lower side, being arranged below.

Figure 8A:
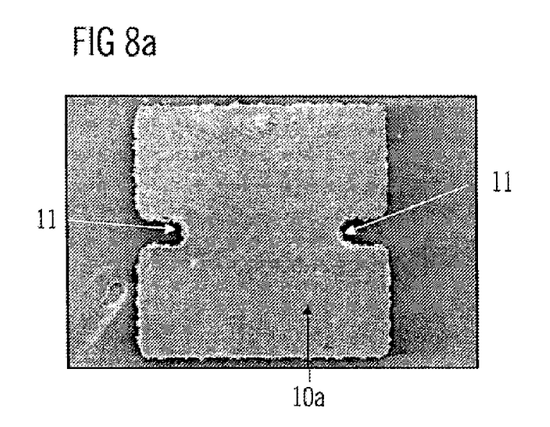
FIGS. 8a to 8f show electron-microscopic images of a wavelength conversion element which is produced according to a second embodiment of the method.
Figure 8B:
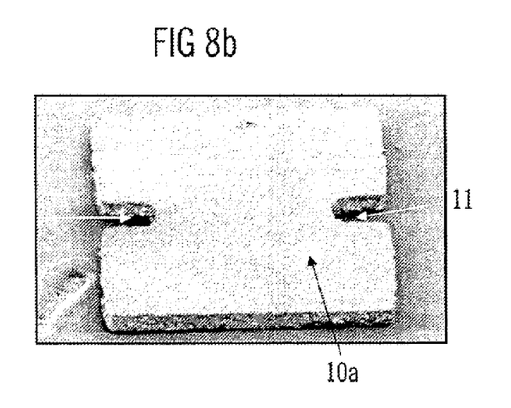
Figure 8C:
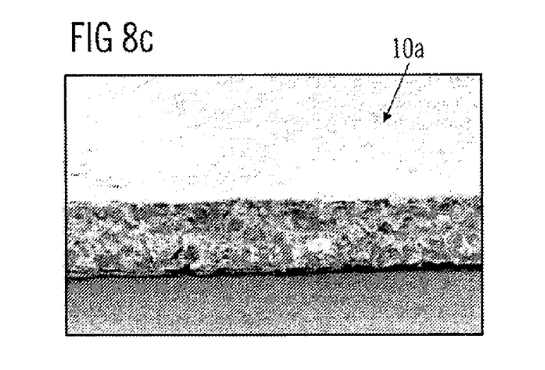
Figure 8D:
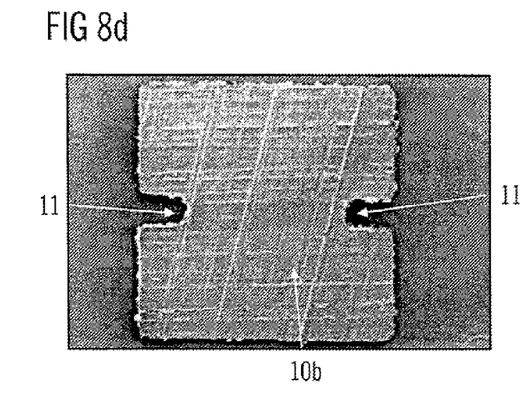
Figure 8E:
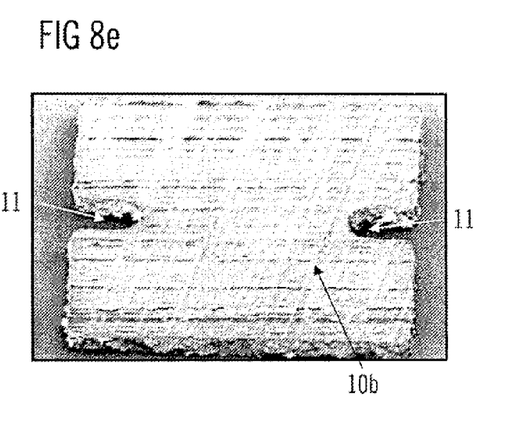
Figure 8F:
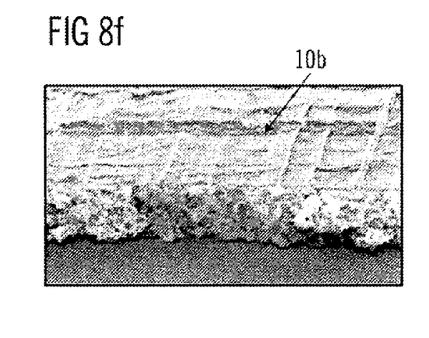

FIGS. 8a to 8f show electron-microscopic images of this wavelength conversion element. FIGS. 8a to 8c show the first surface 10a, and FIGS. 8d to 8f show the second surface 10b. Particularly in FIGS. 8b and 8c, the sharp edges between the first surface 10a and the side edges of the wavelength conversion element can again be seen.

The sharp edges, which can be seen in the examples of the wavelength conversion element, show that the method is highly suitable for producing wavelength conversion elements which can be used in an optoelectronic component and be flush therein with a potting enclosing the wavelength conversion element.

The present application claims the priority of the German application DE 10 2013 104 776.9, the disclosure content of which is hereby incorporated by reference.

The invention is not restricted by the description with the aid of the exemplary embodiments to said exemplary embodiments. Rather, the invention covers any new feature and any combination of features, which includes in particular any combination of features in the patent claims, even if this feature or this combination is not explicitly indicated per se in the patent claims or exemplary embodiments.

The invention claimed is:

1. A method for producing a wavelength conversion element, having the method steps:
    A) providing a wavelength conversion layer having a first surface and a second surface opposite the first surface, the second surface being arranged on a carrier layer,
    B) treating the first surface with a plasma,
    C) stamping at least the wavelength conversion layer, wherein at least one wavelength conversion element having a first surface and an opposite second surface is obtained.

2. The method according to claim 1, wherein the carrier layer is removed after method step B).

3. The method according to claim 1, wherein the second surface of the wavelength conversion layer is treated with a plasma in a method step B1) following method step B).

4. The method according to claim 1, wherein, in method step C), the wavelength conversion layer is stamped and the wavelength conversion element is collected in a container.

5. The method according to claim 1, wherein, in method step C), the wavelength conversion layer is stamped and the wavelength conversion element is arranged with the second surface on an auxiliary layer.

6. The method according to claim 1, wherein, in method step C), the wavelength conversion layer and the carrier layer are stamped and the wavelength conversion element arranged on the stamped carrier layer is obtained.

7. The method according to claim 1, wherein in method step C), the stamped carrier layer is arranged with the side facing away from the wavelength conversion element on an adhesive layer.

8. The method according to claim 7, wherein, in a method step C1) following method step C), an auxiliary layer is arranged on the first surface of the wavelength conversion element and the adhesive layer is removed.

9. The method according to claim 1, wherein a stamping tool that has an internal shape which is selected from quadrilateral, round, quadrilateral with at least one recess, and round with at least one recess, is used in method step C).

10. A wavelength conversion element which is produced by a method according to claim 1.

11. A wavelength conversion element comprising a first surface and a second surface opposite the first surface, the first surface and/or the second surface being vitrified by a vitrification, such that the wavelength conversion element comprises a glass material starting from the first surface and/or the second surface in a vertical direction as far as a penetration depth of the vitrification, and beyond the penetration depth of the vitrification comprises a material which is stickier than the glass material.

12. The wavelength conversion element according to claim 11, which has sharp edges on the side of the first and/or second surface.

13. The wavelength conversion element according to claim 11, which has a thickness which is selected from the range of 30μm to 300μm.

14. The wavelength conversion element according to claim 11, wherein the penetration depth corresponds to at most 2% of the thickness of the wavelength conversion element.

15. The wavelength conversion element according to claim 11, which has an area that is selected from the range of 0.1 mm$^2$ to 20 mm$^2$.

16. An optoelectronic component comprising a radiation-emitting semiconductor chip and a wavelength conversion element according to claim 1, which is arranged with the first surface or the second surface on the semiconductor chip in the beam path of the semiconductor chip.

17. The optoelectronic component according to claim 16, furthermore comprising a potting which encloses the semiconductor chip and is flush with the second surface or the first surface of the wavelength conversion element.

* * * * *

UNITED STATES PATENT AND TRADEMARK OFFICE
CERTIFICATE OF CORRECTION

| | | |
|---|---|---|
| PATENT NO. | : 9,537,064 B2 | Page 1 of 1 |
| APPLICATION NO. | : 14/889837 | |
| DATED | : January 3, 2017 | |
| INVENTOR(S) | : Britta Goeoetz et al. | |

It is certified that error appears in the above-identified patent and that said Letters Patent is hereby corrected as shown below:

In the Claims

In Column 12, Line 53:
Replace "according to claim 1" with --according to claim 11--.

Signed and Sealed this
Tenth Day of April, 2018

Andrei Iancu
*Director of the United States Patent and Trademark Office*